(12) United States Patent
Toh

(10) Patent No.: US 6,694,210 B1
(45) Date of Patent: Feb. 17, 2004

(54) PROCESS RECIPE MODIFICATION IN AN INTEGRATED CIRCUIT FABRICATION APPARATUS

(75) Inventor: Woon Y. Toh, Saratoga, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 10/215,985

(22) Filed: Aug. 8, 2002

(51) Int. Cl.[7] .............................................. G06F 19/00
(52) U.S. Cl. ...................... 700/121; 700/117; 700/116; 438/5
(58) Field of Search ............................ 700/28, 90, 95, 700/117, 121, 108, 116; 118/697, 695; 156/345.24; 438/5; 708/190

(56) References Cited

U.S. PATENT DOCUMENTS

| | | | |
|---|---|---|---|
| 5,886,896 A | * | 3/1999 | Lantz et al. ............... 700/116 |
| 5,914,879 A | * | 6/1999 | Wang et al. ............... 700/111 |
| 5,939,886 A | * | 8/1999 | Turner et al. ............... 324/464 |
| 6,213,848 B1 | * | 4/2001 | Campbell et al. ............ 451/41 |
| 6,484,064 B1 | * | 11/2002 | Campbell .................. 700/100 |

* cited by examiner

Primary Examiner—Jayprakash N. Gandhi
(74) Attorney, Agent, or Firm—Michael B. Einschlag

(57) ABSTRACT

One embodiment of the present invention is a method for modifying process recipe information utilized by a wafer processing system having a controller with permanent rewritable storage, memory, a first and a second communication interface, and a user interface; and one or more process cells to process a wafer; which method comprises steps of: (a) storing baseline process recipe information in permanent rewritable storage; (b) retrieving baseline process recipe information from permanent rewritable storage for a wafer in a group of wafers to be processed and storing it in memory; (c) receiving process recipe modification information utilizing the second communication interface and storing the process recipe modification information in memory; (d) overwriting at least portions of the baseline recipe information in memory with the process recipe modification information to form new recipe information; and (e) processing the wafer utilizing the new recipe information.

10 Claims, 1 Drawing Sheet

PROCESS RECIPE MODIFICATION IN AN INTEGRATED CIRCUIT FABRICATION APPARATUS

TECHNICAL FIELD OF THE INVENTION

One or more embodiments of the present invention pertain to method and apparatus to modify process recipes in apparatus utilized, for example, and without limitation, to fabricate integrated circuit ("IC") devices.

BACKGROUND OF THE INVENTION

FIG. 1 is a pictorial representation of prior art wafer processing system 100 that is utilized to fabricate integrated circuit ("IC") devices. As shown in FIG. 1, wafer processing system 100 comprises one or more process cells 103–105, wafer transfer system 121, and factory interface 122. Each of process cells 103–105 is configured to perform a process on a wafer such as, for example, and without limitation, a chemical vapor deposition (CVD) process, a physical vapor deposition (PVD) process, an electro-chemical plating (ECP) process, and so forth. Factory interface 122 includes cassette loadlock 123. Cassette loadlock 123 stores one or more wafer cassettes, and individual wafers are moved from cassette loadlock 123 to process cells 103–105 by wafer transfer system 121. Further, the functions performed by wafer processing system 100, and the order in which these functions are performed, are controlled by tool controller 200. Tool controller 200 is connected to each of the above-described system components in a manner that is well known to those of ordinary skill in the art to provide data and instructions thereto, and to receive data therefrom. In particular, with respect to process cells 103–105, at least a portion of the data and instructions provided thereto includes information that is referred to herein as "process recipe information" or process recipes or recipes. As is well known to those of ordinary skill in the art, a recipe specifies, among other things, timing, duration, and sequences of events that take place in a processing cell. As such, a recipe may be utilized, for example, to activate gas valves to enable gases to enter a process cell, to set ratings for heaters to enable process temperatures to be set, to set ratings for pumps to enable process pressures to be set, and so forth.

As is well known, wafer processing systems like that shown in FIG. 1 are designed to provide substantially similar processing results (i.e., within predetermined manufacturing tolerances) for as long as possible. Further, as dimensions used to fabricate IC devices become smaller, manufacturing tolerances are becoming smaller and deviations from such tolerances are becoming more costly. As such, there is a substantial benefit in discovering processing results that exceed the predetermined manufacturing tolerances. The benefit accrues when, for example, a process cell that is producing poor processing results is identified and removed from service. This is advantageous because a source of defective IC devices is removed from service in the factory, and waste is reduced.

However, it has been determined that additional benefits can be had by studying processing results, and identifying a tendency of a process cell to produce processing results that (while being within manufacturing tolerance limits) are approaching tolerance limits. Further, it has been determined that such additional benefits can be obtained in such instances by taking two types of actions. The first type of action is to modify processing recipes of downstream wafer processing systems to compensate for processing results produced by an identified process cell. The second type of action is to modify processing recipes of the identified process cell to cause its processing results to be closer to a center of the tolerance limit range. These actions provide still further benefits in that they may prolong the time before processing cells have to be taken out of service for maintenance.

In light of the above, there is a need for method and apparatus to enable such new or modified recipes to be transmitted to and used by, wafer processing systems.

SUMMARY OF THE INVENTION

One or more embodiments of the present invention advantageously satisfy the above-identified need. In particular, one embodiment of the present invention is a method for modifying process recipe information utilized by a wafer processing system having a controller with permanent rewritable storage, memory, a first and a second communication interface, and a user interface; and one or more process cells to process a wafer; which method comprises steps of: (a) storing baseline process recipe information in permanent rewritable storage; (b) retrieving baseline process recipe information from permanent rewritable storage for a wafer in a group of wafers to be processed and storing it in memory; (c) receiving process recipe modification information utilizing the second communication interface and storing the process recipe modification information in memory; (d) overwriting at least portions of the baseline recipe information in memory with the process recipe modification information to form new recipe information; and (e) processing the wafer utilizing the new recipe information.

DETAILED DESCRIPTION

Figure 1:
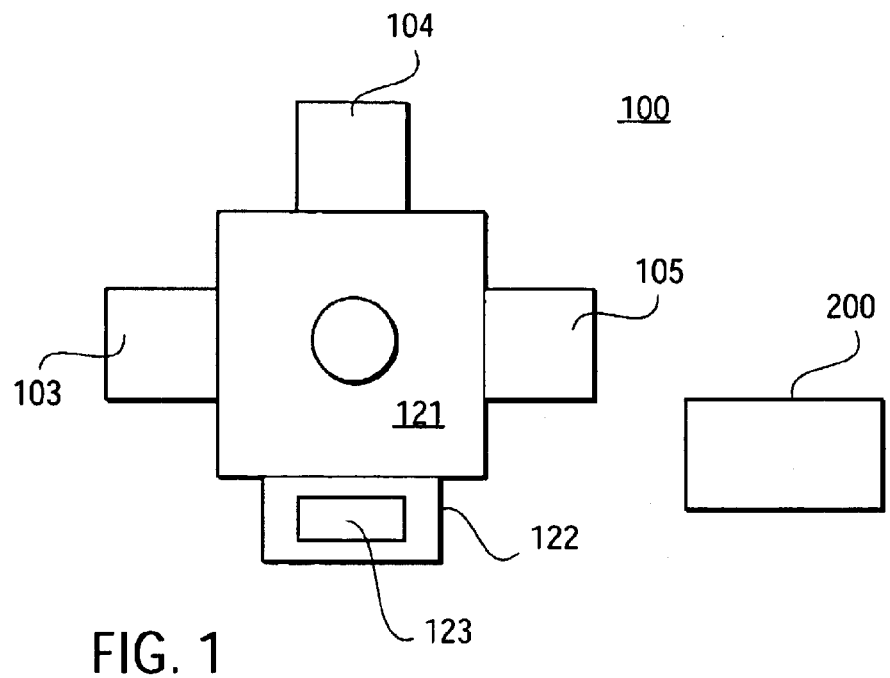
FIG. 1 is a pictorial representation of a wafer processing system that is utilized to fabricate integrated circuit ("IC") devices.
Figure 2:
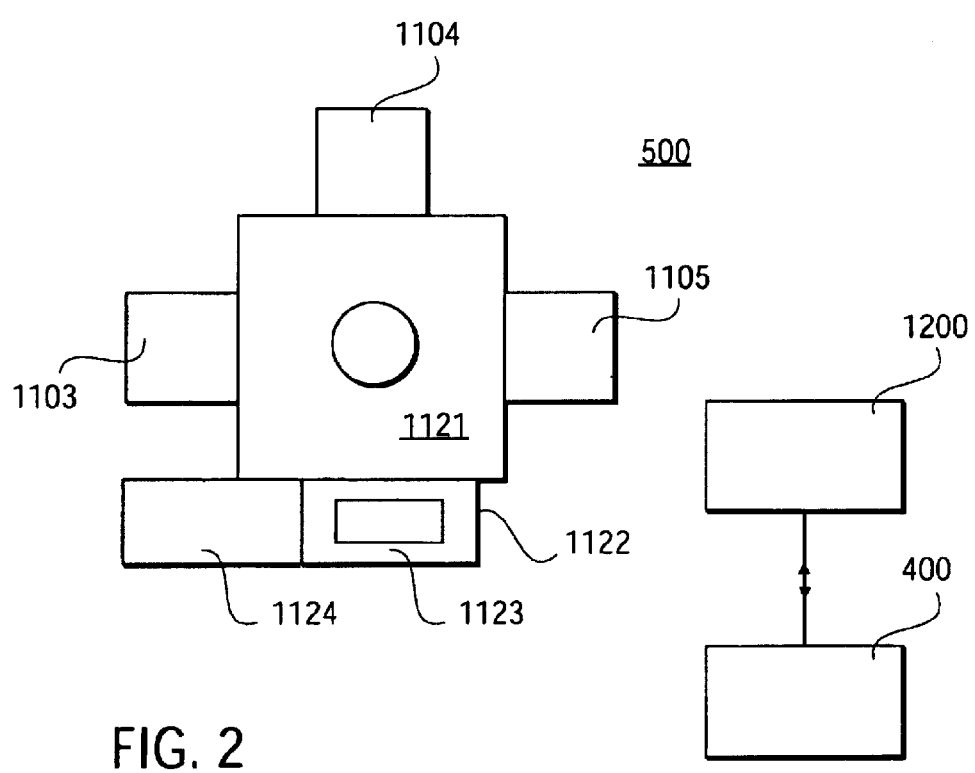
FIG. 2 is a pictorial representation of the wafer processing system shown in FIG. 1 used in conjunction with a module controller system in accordance with one or more embodiments of the present invention.

FIG. 2 is a pictorial representation of wafer processing system 500 that is used in conjunction with module controller system 400 in accordance with one or more embodiments of the present invention. In accordance with one or more embodiments of the present invention, wafer processing system 500 is like wafer processing system 100 shown in FIG. 1 in that it comprises one or more process cells 1103–1105, wafer transfer system 1121, and factory interface 1122, wherein: (a) each of process cells 1103–1105 is configured to perform a process on a wafer such as, for example, and without limitation, a chemical vapor deposition (CVD) process, a physical vapor deposition (PVD) process, an electro-chemical plating (ECP) process, and so forth; (b) factory interface 1122 includes cassette loadlock 1123 (cassette loadlock 1123 stores one or more wafer cassettes, and individual wafers are moved from cassette loadlock 1123 to process cells 1103–1105 by wafer transfer system 1121); and (c) the functions performed by wafer processing system 500, and the order in which these functions are performed, are controlled by tool controller 1200. However, wafer processing system 500 is different from wafer processing system 100 shown in FIG. 1 in that: (a) wafer processing system 500 further includes metrology/inspection/review cell 1124 that comprises one or more metrology/inspection/review tools that perform metrology/ inspection/review processes on wafers, for example, wafers processed by wafer processing system 500 (it should be understood that one metrology/inspection/review cell may receive wafers processed by several wafer processing systems, and that wafers may be processed by metrology/ inspection/review tools in several inspection/review cells) the metrology/inspection/review tools measure and test wafer characteristics and wafer defects, and in general, metrology/inspection/review tools may include any form of instrument, equipment, or process (either in combination or individually) that measures, for example, and without limitation, dimensions of structures on a wafer, or facilitates identification of defects on a wafer or defects in an IC formed on the wafer (generally referred to herein as defects or wafer defects interchangeably); and (b) tool controller 1200 is different from tool controller 200. Like tool controller 200, tool controller 1200: (a) is connected to each of the above-described system components, in a manner that is well understood by those of ordinary skill in the art, to provide data and instructions thereto, and to receive data therefrom; (b) controls functions performed by wafer processing system 500, and the order in which these functions are performed; and (c) with respect to process cells 1103–1105, at least a portion of the data and instructions provided thereto includes information that is referred to herein as "process recipe information" or process recipes or recipes (as is well known to those of ordinary skill in the art, a process recipe specifies, among other things, timing, duration, and sequences of events that take place in a process cell). However, unlike tool controller 200, and in accordance with one or more embodiments of the present invention, tool controller 1200 can modify or change process recipes used in various ones of process cells 1103–1105 in response to information received from module controller system 400.

In accordance with one or more embodiments of the present invention, module controller system 400 may utilize results produced by the metrology/inspection/review tools to develop new recipes for use by wafer processing system 500, and other downstream wafer processing systems. Advantageously, in accordance with one or more embodiments of the present invention, such modifications enable the processing results provided by process cells 1103–1105 within wafer processing system 500 and/or by process cells in the other downstream wafer processing systems to be maintained within predetermined manufacturing tolerances.

It should be understood that embodiments of the present invention are not limited to those wherein wafer processing system 500 includes metrology/inspection/review cell 1124. In fact, further embodiments exist wherein metrology/ inspection/review tools are remote from wafer processing system 500. Still further embodiments exist wherein analysis of results provided by the metrology/inspection/review tools are carried out by systems other than module controller 400.

As is well known, process recipes may be transmitted to tool controller 1200: (a) manually from an operator using a system user interface; or (b) automatically by means of data communication from a factory host such as, for example, and without limitation, a Manufacturing Execution System ("MES") over a communication interface (for example, a SECS/GEM port) using, for example, a well known SECS transmission protocol. In particular, such data communications typically are provided to tool controller 1200 through a first SECS/GEM port. SECS, the SEMI Equipment Communication Standard, enables computer-controlled process and metrology tools from a variety of vendors to communicate with various types of host computers using a standard protocol in an integrated circuit ("IC") manufacturing or fabrication facility ("fab"). Process recipe information received by input utilizing the user interface or the first SECS/GEM port is stored at wafer processing system 500 by tool controller 1200, typically in permanent rewritable storage such as, for example and without limitation, a hard disk.

As is known, wafers are typically processed in groups that are stored in a unit that is typically referred to as a cassette (a typical cassette holds twenty-five (25) wafers). The following identification information is used to identify process recipe information stored in permanent rewritable storage so that such information can be retrieved for use in processing wafers in the cassette: (a) a sequence recipe ID or name (i.e., an ID that relates to the entire cassette or to each wafer in the cassette); and (b) a process recipe ID for each process cell by which a wafer will be processed in the wafer processing system (also referred as a sequence number) in the cassette. This identification information can be entered in one of two ways: (a) the operator can define a sequence recipe ID for the entire cassette or for each wafer in the cassette (a material ID or lot ID ("MID") is associated with the entire cassette of wafers—this is sometimes also referred to as a cassette ID); and (b) the factory host, using the first SECS/ GEM port, can define the sequence recipe for the entire cassette or for each wafer (an MID is associated with the entire cassette). For example, assume that wafer processing system includes process cells A through E. Then, a sequence recipe for wafer 1 might specify that wafer 1 proceed first through process cell E, next through process cell A, and finally through process cell C. As a result, the following information may be specified for the $i^{th}$ wafer in the cassette: (a) MID or lotID for the cassette; (b) the sequence recipe ID for the cassette; (c); the number of process cells used to process the $i^{th}$ wafer in wafer processing system 1000; and (d) a process recipe name for each process cell for the $i^{th}$ wafer (for example: (i) process cell A recipe name, (ii) process cell B recipe name, and so forth). In accordance with one or more embodiments of the present invention, the above-described identification information is tracked on a wafer by wafer basis because each wafer may be assigned a different sequence recipe, and more that one sequence recipe can utilize the same process recipe in different process cells.

In accordance with one or more embodiments of the present invention, module controller system 400 makes modifications or changes to the process recipes stored at wafer processing system 500. To do so, tool controller 1200 requests (i.e. demands) temporary process recipe changes from module controller system 400 before processing a wafer. In response, tool controller 1200 receives any modification information sent by module controller system 400 at a second communication interface (for, example, a second SECS/GEM port). The process recipe information received utilizing the second SECS/GEM port, i.e., information received from module controller system 400, is then stored in memory (i.e., temporary or volatile memory) for subsequent use. In accordance with one or more such embodiments, modification process recipe information received from module controller system 400 does not get written back to permanent rewritable storage. In this way, after processing is complete, the original or "baseline" process recipe information entered by the operator or the factory host is maintained without having been altered by temporary changes provided by module controller system 400. Advantageously, this enables the operator or the factory host to maintain track of recipes s/he or it sent to tool controller 1200. In essence, this maintains the recipes as the "customer" (i.e., the operator or the factory host) created them.

The following describes a method by which process recipe information is obtained for use by tool controller 1200.

Whenever wafers are to be processed utilizing wafer processing system 500, a group of wafers in a cassette is placed in cassette loadlock 1123 of factory interface 1122. Next, a cassette ID (also referred to as a lot ID or MID) is transmitted to tool controller 1200. This occurs: (a) by receiving operator input through the system user interface; (b) by receiving input from the factory host using the first SECS/GEM port; or (c) automatically by a cassette ID reader in factory interface 1122 (for example, and without limitation, a barcode reader). Next, whenever a wafer is retrieved from the cassette for transfer into the transfer chamber, a sequence number (for example, the slot number of the wafer in the cassette) is transmitted to the tool controller 1200 from factory interface 1122.

Next, in accordance with one or more embodiments of the present invention, in order to process the wafer, tool controller 1200 (by means of process cell task logic contained therein) accesses the permanent rewritable storage on a wafer by wafer basis. To do this for the $i^{th}$ wafer in the cassette, tool controller 1200 uses the sequence recipe and process recipe name information for that sequence recipe as keys to retrieve a process recipe for each process cell in the sequence recipe for $i^{th}$ wafer (the process recipe retrieved is nominal or baseline process recipe information for use in processing the wafer). Tool controller 1200 then stores the retrieved process recipe information in a data structure for use during processing. Next, tool controller 1200 sends a message to module controller 400 utilizing the second SECS/GEM port to request any process recipe modification or change information for the $i^{th}$ wafer, which message identifies the wafer by lot ID, sequence recipe, and sequence number in the cassette. Next, module controller system 400 sends any process recipe modification information to tool controller 1200 utilizing the second SECS/GEM port. For example, in accordance with one embodiment, module controller 400 sends all changes that need to be temporarily applied to the process recipe for a given process cell, and tool controller 1200 will keep this information in a structure, for example, a lookup table, that describes all the process recipe parameters that need to be temporarily changed for a given process cell. Next, tool controller 1200 writes the modifications or changes over the nominal or baseline process recipe information stored in the data structure in memory. For example, in accordance with one or more such embodiments of the present invention, tool controller 1200 reviews the modifications, on a step by step basis, and applies the modifications by overwriting existing information in the data structure in memory. Next, tool controller 1200 directs wafer transfer system 1121 to transfer the wafer to the appropriate one of process cells 1103–1105 in accordance with the sequence recipe for the $i^{th}$ wafer in the cassette. Next, tool controller 1200, utilizing the process recipe information stored in the data structure in memory for the wafer, sends data and instructions to the particular one of process cells 1103–1105 to process the particular wafer. Next, after processing by one of process cells 1103–1105, the wafer may be transferred to another one of process cells 1103–1105 for further processing in accordance with the sequence recipe for the $i^{th}$ wafer. As is known, some wafers may be retrieved from the cassette before processing is complete on other wafers (for example, in a wafer processing system that includes multiple process cells). Further, information relating to changes for some wafers may be retrieved while other wafers are being processed.

In accordance with one or more embodiments of the present invention, temporary process recipe modification or change information may be provided to tool controller 1200 on a step by step or process recipe basis. For example, in accordance with one or more such embodiments, such information is provided from module controller 400 in an XML stream that identifies the various steps of the process recipe information that are to be changed. In accordance with one or more such embodiments of the present invention, the temporary process recipe change information provided by module controller system 400 includes: (a) process cell index or ID; (b) process recipe step number; (c) process recipe step parameter name (for example, a pointer to an ASCII string) representing a name of a process recipe step parameter; (d) parameter value (a pointer to a 32-bit integer) representing a new process recipe step parameter value; and (e) recipe name (an ASCII string that is the process recipe name for the given process cell).

In accordance with one or more alternative embodiments of the present invention, whenever module controller system 400 wishes to provide temporary recipe change information to tool controller 1200, module controller system 400 transmits the temporary recipe change information over the second SECS/GEM port. In response, tool controller 1200 sets a system constant referred to as "EC" that is related to a particular process cell to a non-zero number, and stores the temporary process recipe change information transmitted in memory. Next, process cell task logic in tool controller 1200 retrieves process recipe information from the permanent rewritable storage. Next, before starting wafer processing for the process cell, the process cell task logic checks the current value of EC. If EC is zero, there is no temporary recipe change information available, and wafer processing can begin. However, if EC is nonzero, the process cell task logic checks for module controller supplied temporary process recipe change information, and writes the information into the data structure.

Advantageously, in accordance with one or more embodiments of the present invention, module controller system 400 may provide recipe adjustments to individual process cell tasks.

Those skilled in the art will recognize that the foregoing description has been presented for the sake of illustration and description only. As such, it is not intended to be exhaustive or to limit the invention to the precise form disclosed. For example, the term wafer or substrate used above is used in the broadest sense, and as such, includes wafers or substrates fabricated from all kind of materials such as, for example, and without limitation, semiconductor materials such as, for example, and without limitation, silicon, and wafers or substrates formed of a glass.

What is claimed is:

1. A method for modifying process recipe information utilized by a wafer processing system having a controller with permanent rewritable storage, memory, a first and a second communication interface, and a user interface; and one or more process cells to process a wafer; which method comprises steps of:

storing baseline process recipe information in permanent rewritable storage;

retrieving baseline process recipe information from permanent rewritable storage and storing it in memory for a wafer in a group of wafers to be processed;

receiving process recipe modification information utilizing the second communication interface and storing the process recipe modification information in memory;

overwriting at least portions of the baseline recipe information in memory with the process recipe modification information to form new recipe information; and processing the wafer utilizing the new recipe information.

2. The method of claim 1 which further comprises steps of:

receiving the baseline process recipe information utilizing the user interface or the first communication interface.

3. The method of claim 2 which further comprises, prior to retrieving the baseline process recipe information:

identifying the group of wafers to be processed;

identifying a wafer in the group;

identifying process recipe information for the group, and identifying process recipe information for each process cell in the wafer processing system to be used to process the wafer.

4. The method of claim 3 wherein the step of identifying process recipe information for the group comprises receiving information utilizing the user interface or the first communication interface.

5. The method of claim 3 wherein the process recipe modification information is provided on a step by step basis for a process cell.

6. The method of claim 1 wherein the process recipe information is received in an XML stream.

7. The method of claim 3 wherein the process recipe modification information includes: (a) process cell index or ID; (b) process recipe step number; (c) process recipe step parameter name; (d) parameter value; and (e) process recipe name.

8. The method of claim 1 wherein the controller receives process recipe modification information and sets an indicator that such information has been received.

9. The method of claim 1 wherein the step of receiving process recipe modification information comprises receiving from a controller system that transmits process recipe modification information to a multiplicity of wafer processing systems.

10. The method of claim 1 wherein the step of receiving process recipe modification information further comprises first requesting the process recipe modification utilizing the second communication interface.

* * * * *